US008664510B2

(12) United States Patent
Ojima et al.

(10) Patent No.: US 8,664,510 B2
(45) Date of Patent: Mar. 4, 2014

(54) INFRARED ABSORBER AND THERMAL INFRARED DETECTOR

(75) Inventors: Fumikazu Ojima, Hamamatsu (JP); Jun Suzuki, Hamamatsu (JP); Ryusuke Kitaura, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 506 days.

(21) Appl. No.: 12/161,868

(22) PCT Filed: Jan. 24, 2007

(86) PCT No.: PCT/JP2007/051085
§ 371 (c)(1),
(2), (4) Date: Oct. 16, 2008

(87) PCT Pub. No.: WO2007/086424
PCT Pub. Date: Aug. 2, 2007

(65) Prior Publication Data
US 2009/0301542 A1 Dec. 10, 2009

(30) Foreign Application Priority Data
Jan. 25, 2006 (JP) ................. P2006-016733

(51) Int. Cl.
*H01L 35/32* (2006.01)
(52) U.S. Cl.
USPC ................. 136/225; 136/224; 136/239
(58) Field of Classification Search
USPC ............ 136/200, 201, 204, 224, 225; 250/339.04, 338.4, 338.1, 332, 353, 250/338.2, 338.3; 438/72, 96
See application file for complete search history.

(56) References Cited

U.S. PATENT DOCUMENTS 5,021,663 A * 6/1991 Hornbeck ............... 250/349
7,005,644 B2 * 2/2006 Ishikawa et al. ......... 250/339.04
(Continued)

FOREIGN PATENT DOCUMENTS

JP H6-258144 9/1994
JP 2523895 5/1996
(Continued)

OTHER PUBLICATIONS

Chen et al., Miromachined Uncooled IR Bolometer Linear Array Using VO2 Thin Films, Interantional Journal of Infrared and Millimeter Waves, Vol, 22, No. 1, pp. 53-58, 2001.*

(Continued)

*Primary Examiner* — Jayne Mershon
(74) *Attorney, Agent, or Firm* — Drinker Biddle & Reath LLP

(57) ABSTRACT

The infrared ray absorbing film 2 is provided with a first layer 21 containing TiN and a second layer 22 containing an Si based compound, converting energy of infrared ray made incident from the second layer 22 to heat. TiN is high in absorption rate of infrared ray over a wavelength range shorter than 8 μm, while high in reflection rate of infrared ray over a wavelength range longer than 8 μm. Therefore, if an Si based compound layer excellent in absorption rate of infrared ray over a longer wavelength range is laminated on a TiN layer, infrared ray over a wavelength range lower in absorption rate on the TiN layer can be favorably absorbed on the Si based compound layer, and also infrared ray in an attempt to transmit the Si based compound layer can be reflected on a boundary surface of the TiN layer and returned to the Si based compound layer.

3 Claims, 6 Drawing Sheets

(56) References Cited

U.S. PATENT DOCUMENTS

| | | |
|---|---|---|
| 2004/0200962 A1 | 10/2004 | Ishikawa et al. |
| 2006/0186339 A1* | 8/2006 | Sasaki et al. ............... 250/338.1 |
| 2007/0176104 A1* | 8/2007 | Geneczko et al. ......... 250/338.1 |

FOREIGN PATENT DOCUMENTS

| | | |
|---|---|---|
| JP | 2000-321125 | 11/2000 |
| JP | 2000-337958 | 12/2000 |
| JP | 2001-215151 | 8/2001 |
| JP | 2001-330511 | 11/2001 |
| JP | 2002-162291 | 6/2002 |
| JP | 2004-085331 | 3/2004 |
| JP | 3608427 | 10/2004 |
| JP | 2005-043148 | 2/2005 |
| JP | 2005-043381 | 2/2005 |
| JP | 2007-57427 | 3/2007 |
| JP | 2007-198852 | 8/2007 |
| TW | 200403781 | 3/2004 |

OTHER PUBLICATIONS

Goncalves et al., Thermoeelctric Microstructures of $Bi_2Te_3/Sb_2Te_3$ for a Self-Calibrated Micropyrometer, The 13th Internationa Conference on Solid-State Sensors, Actuators and Microsysems, Seoul, Korea, pp. 904-907, 2005.*

* cited by examiner

INFRARED ABSORBER AND THERMAL INFRARED DETECTOR

TECHNICAL FIELD

The present invention relates to an infrared ray absorber and a thermal infrared ray detector.

BACKGROUND ART

A conventional thermal infrared ray detector includes, for example, that described in Patent Document 1 or 2. Patent Document 1 has disclosed a pyroelectric infrared ray solid-state image pickup device. An infrared ray absorbing film used in the device has a laminated structure composed of an organic layer sensitive in a wide range of infrared ray and an $SiO_2$ layer high in absorption rate in the vicinity of a wavelength of 10 μm.

Further, Patent Document 2 has disclosed a thermal infrared ray sensor. The sensor has a multi-structured infrared ray absorbing film containing a metal thin film at the lowermost layer. The metal thin film is greater in reflection rate of infrared ray than in transmission rate of infrared ray, attempting to increase the absorption rate of infrared ray on other layers by allowing infrared ray in an attempt to transmit through the other layers to reflect on the metal thin film.
Patent Document 1: Japanese Patent No. 2523895
Patent Document 2: Japanese Patent No. 3608427

DISCLOSURE OF THE INVENTION

Problem to be Solved by the Invention

In general, an infrared ray absorber is formed on a substrate to keep a mechanical strength. Then, in order to attain an accurate detection of heat generated by the infrared ray absorber, a substrate portion of a detecting region is removed by wet etching or others (membrane structure: refer to Patent Document 2, for example). However, where an organic layer is contained in an infrared ray absorbing film as with the device disclosed in Patent Document 1, the organic layer is lower in resistance to wet etching, thus posing a difficulty in processing a substrate.

Further, on detection of infrared ray, it is preferable to detect the ray over a wider wavelength range at a higher efficiency. Patent Document 2 has not described anything about the detection capability over a wider wavelength range.

The present invention has been made in view of the above problem, an object of which is to provide an infrared ray absorber in which a substrate can be easily subjected to wet etching, and infrared ray can be absorbed over a wider wavelength range at a higher efficiency and a thermal infrared ray detector.

Means for Solving the Problem

In order to solve the above problem, the infrared ray absorber of the present invention includes a first layer containing TiN; and a second layer containing an Si based compound and provided on the first layer, converting energy of infrared ray made incident from the second layer to heat.

TiN is characterized in that it is higher in absorption rate of infrared ray over a wavelength range shorter than 8 μm than other inorganic materials, while higher in reflection rate of infrared ray over a wavelength range longer than 8 μm. Therefore, if a second layer excellent in absorption rate of infrared ray longer than 8 μm in a wavelength range is laminated on a first layer (TiN layer), infrared ray over a range wavelength lower in absorption rate on the TiN layer can be favorably absorbed on the second layer, and also infrared ray in an attempt to transmit the second layer can be reflected on a boundary surface of the TiN layer and returned to the second layer. Thereby, it is possible to efficiently absorb infrared ray over a wider wavelength range including both a wavelength range shorter than 8 μm and a wavelength range longer than 8 μm. The above-described infrared ray absorber is provided on a first layer containing TiN with a second layer containing an Si based compound high in absorption rate of infrared ray over a wavelength range longer than 8 μm. Thereby, it is possible to efficiently absorb infrared ray over a wider wavelength range.

Further, in the above-described infrared ray absorber, the first layer containing TiN mainly absorbs infrared ray over a wavelength range shorter than 8 μm and also reflects infrared ray longer than 8 μm in a wavelength range toward the second layer. Thus, one layer is provided with both a function of absorbing infrared ray over a certain range of wavelength and that of reflecting infrared ray over other ranges of wavelength to other layers, thereby making it possible to efficiently absorb infrared ray over a wider wavelength range by the use of a smaller number of layers than a case where a layer mainly for reflection is provided.

Further, since TiN and an Si based compound are high in resistance to wet etching, a substrate can be easily subjected to wet etching. Therefore, according to the above-described infrared ray absorber, it is possible to easily manufacture a membrane structure at which a substrate portion of a detecting region is removed.

Further, the infrared ray absorber may be such that in which the second layer contains at least one of SiC and SiN as an Si based compound. Thereby, it is possible to attain the above-described effects. SiC and SiN are in particular high in resistance to wet etching as compared with other Si based compounds, and the infrared ray absorber can be, therefore, used to more easily manufacture a membrane structure.

Further, the infrared ray absorber may be that in which the second layer is thicker than the first layer. TiN constituting the first layer is extremely small in transmission rate of infrared ray when the thickness exceeds a certain value, and hardly varies in absorption rate or reflection rate even if the thickness is allowed to change. However, an Si based compound constituting the second layer will be increased in absorption rate as it becomes thicker. Therefore, the second layer containing an Si based compound is made thicker than the first layer containing Ti, by which infrared ray longer than 8 μm in a wavelength range can be more efficiently absorbed.

Still further, the thermal infrared ray detector of the present invention includes any one of the above-described infrared ray absorbers; and a thermoelectric converter, which converts heat from the infrared ray absorber to an electrical quantity. Thereby, such a thermal infrared ray detector is provided that a substrate is easily subjected to wet etching and infrared ray can be efficiently detected over a wider wavelength range.

Effects of the Invention

According to the present invention, it is possible to provide an infrared ray absorber in which a substrate is easily subjected to wet etching and infrared ray can be absorbed efficiently over a wider wavelength range and a thermal infrared ray detector.

Figure 1:
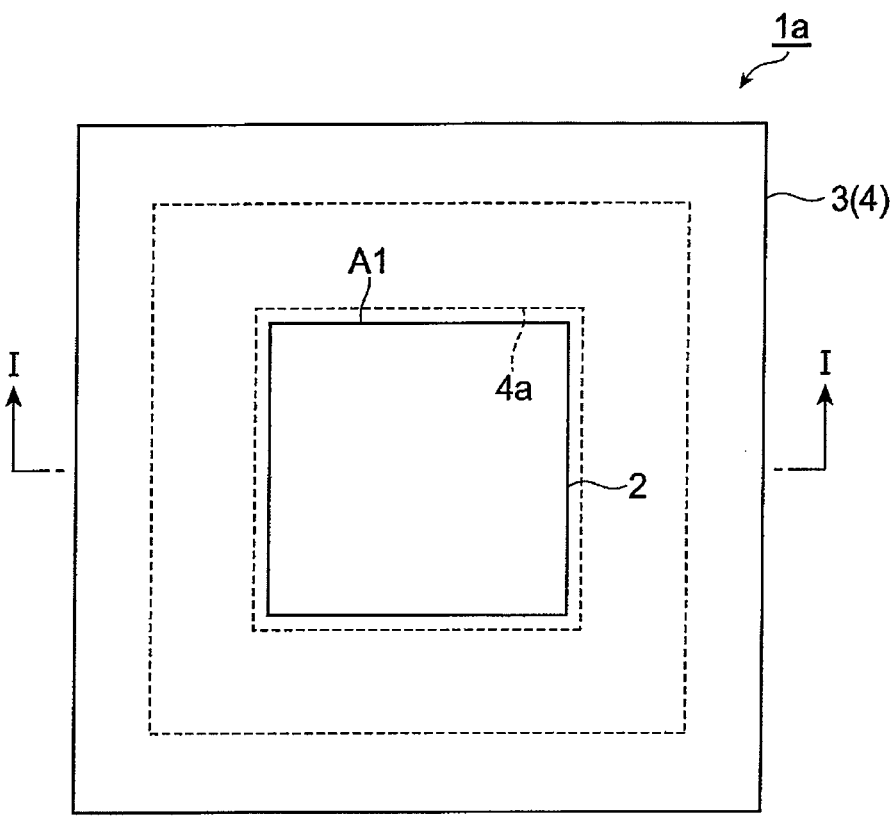
FIG. 1 is a drawing showing Embodiment 1 of a thermal infrared ray detector provided with an infrared ray absorber of the present invention.
Figure 1:
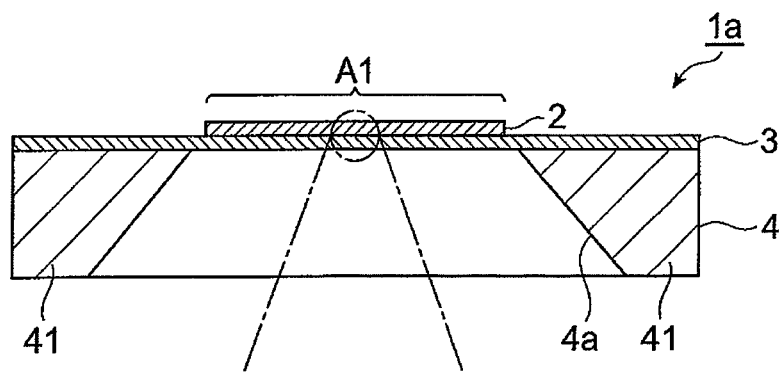
Figure 1:
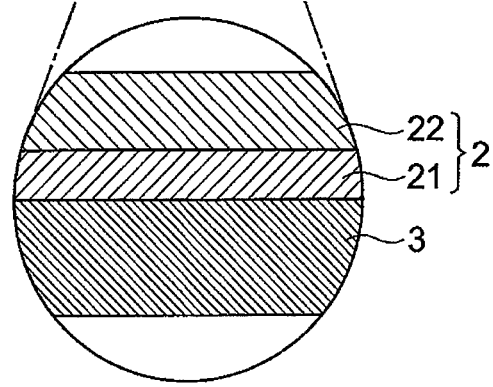

DESCRIPTION OF THE REFERENCE NUMERALS 1a, 1b: thermal infrared ray detector
2, 5: infrared ray absorbing film
3, 6: thermopile forming film
4, 7: silicon substrate
21, 51: first layer
22, 52: second layer

BEST MODES FOR CARRYING OUT THE INVENTION

Hereinafter, a description will be given in detail of preferred embodiments of an infrared ray absorber and a thermal infrared ray detector of the present invention by referring to the drawings. Here, in explaining the drawings, the same symbols are given the same parts or corresponding parts, an overlapping description of which will be omitted here.

Embodiment 1

FIG. 1(a) is a plan view showing Embodiment 1 of a thermal infrared ray detector provided with the infrared ray absorber of the present invention. Further, FIG. 1(b) is a side sectional view showing a cross section taken along the line I-I given in FIG. 1(a). Still further, FIG. 1(c) is an enlarged sectional view in which FIG. 1(b) is partially enlarged.

A thermal infrared ray detector 1a of the present embodiment is a thermal infrared ray detector, which is formed by using so-called bulk micromachine technology and provided with an infrared ray absorbing film 2, a thermopile forming film 3 and a silicon (Si) substrate 4. The silicon substrate 4 is formed in a rectangular flat shape and has a frame portion 41 provided along the outer periphery. An opening 4a corresponding in size to the infrared ray detecting region A1 is formed near the center enclosed by the frame portion 41. A thermopile forming film 3 and an infrared ray absorbing film 2, which will be described later, are given as a membrane structure. In addition, the opening 4a is preferably formed by selective wet etching employed in the silicon substrate 4.

The thermopile forming film 3 is a thermoelectric converter for converting heat from an infrared ray absorbing film 2 to be described later to an electrical quantity (electrical voltage, current and the like). The thermopile forming film 3 is provided on the silicon substrate 4 so as to cover the opening 4a and constituted in such a manner that a plurality of thermoelements are arranged two dimensionally. Hot junctions (thermocouples) of the plurality of thermoelements are respectively arranged inside an infrared ray detecting region A1, and cold junctions are arranged on the frame portion 41.

The infrared ray absorbing film 2 is an infrared ray absorber in the present embodiment and provided at the infrared ray detecting region A1 on the thermopile forming film 3. The infrared ray absorbing film 2 is provided with a first layer 21 mainly containing TiN and a second layer 22 mainly containing an Si based compound such as SiC, SiN, $SiO_2$, $Si_3N_4$ or SiON and provided on the first layer 21, converting energy of infrared ray made incident from the second layer 22 to heat. The second layer 22 is formed so as to be thicker than the first layer 21.

It is preferable that the second layer 22 mainly contains at least one of SiC and SiN as an Si based compound. Further, where the second layer 22 contains mainly $SiO_xN_y$ (0<X≤2, 0≤Y<1) and a composition ratio of oxygen atoms X/(X+Y) is in a range of 0.4 or more to 0.8 or less, the light transmission rate is improved and the moisture resistance is also increased, which is preferable.

Figure 2:
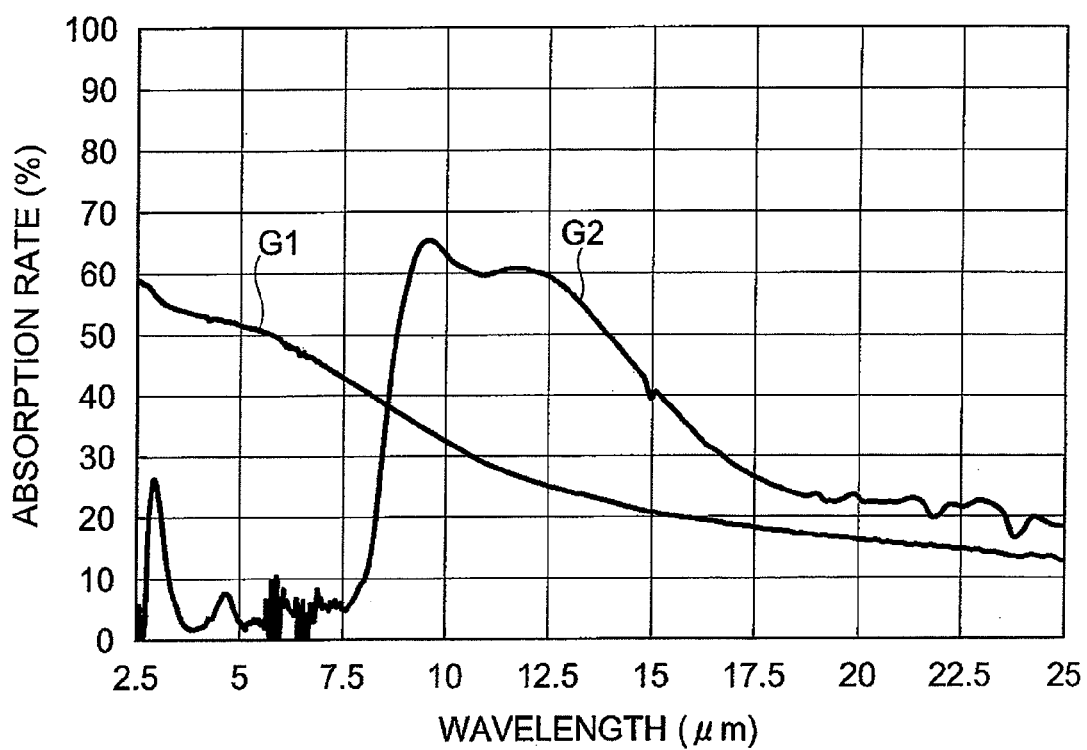
FIG. 2 is a graph showing infrared ray absorption characteristics of TiN and SiC (absorption rate according to incident wavelength).
Figure 3:
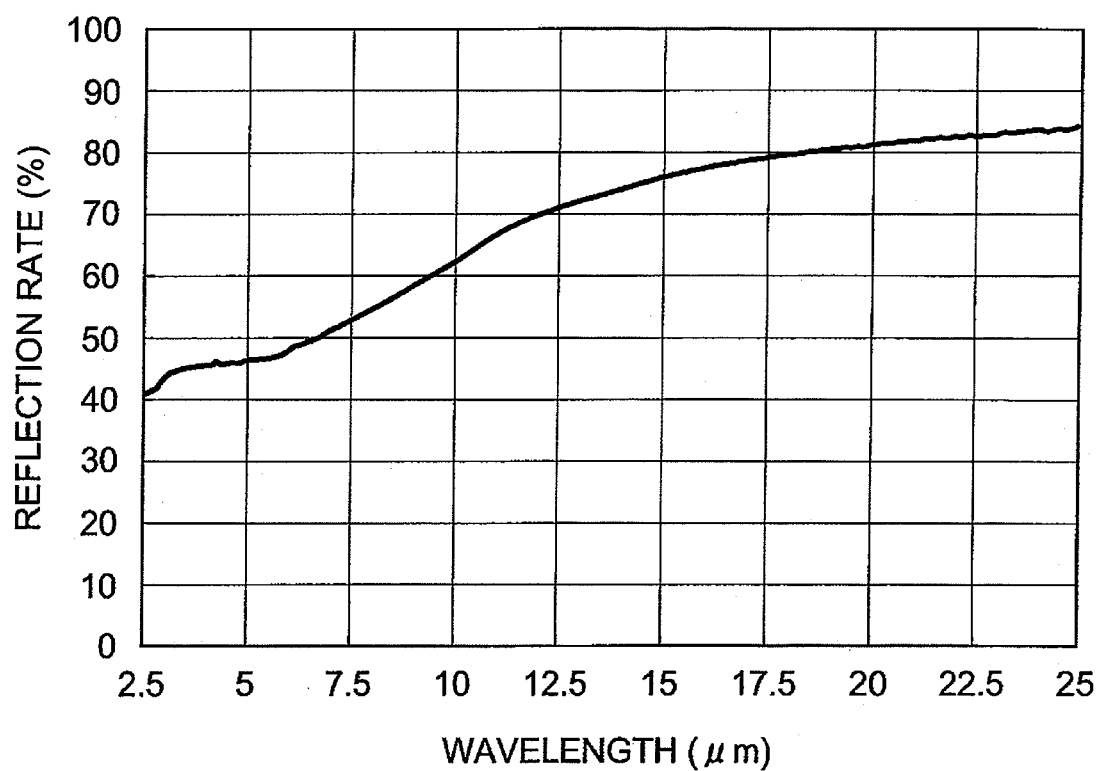
FIG. 3 is a graph showing infrared ray reflection characteristics of TiN (reflection rate according to incident wavelength).

In this instance, FIG. 2 is a graph showing infrared ray absorption characteristics of TiN and SiC (absorption rate according to incident wavelength). Here, in FIG. 2, the graph G1 shows the absorption characteristics of TiN and the graph G2 shows the absorption characteristics of SiC. As shown in FIG. 2, TiN is higher in absorption rate over a relatively short wavelength range, that is, over a wavelength range shorter than 8 μm, for example. Further, SiC is higher in absorption rate over a relatively long wavelength range, that is, over a wavelength range from 8 μm to 14 μm, for example. Still further, FIG. 3 is a graph showing infrared ray reflection characteristics of TiN (reflection rate according to incident wavelength). As shown in FIG. 3, TiN is higher in reflection rate over a relatively long wavelength range, that is, over a wavelength range longer than 8 μm, for example.

Figure 4:
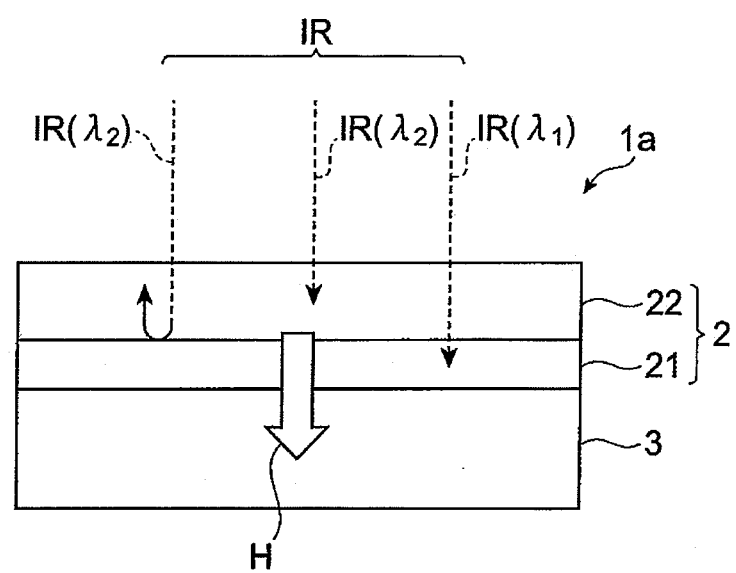
FIG. 4 is a drawing for explaining operations of the thermal infrared ray detector in Embodiment 1.

FIG. 4 is a drawing for explaining operations of the thermal infrared ray detector 1a in the present embodiment. Here, FIG. 4 shows a side cross section at a part corresponding to the infrared ray detecting region A1 in the thermal infrared ray detector 1a.

Infrared ray IR made incident into the infrared ray detecting region A1 of the thermal infrared ray detector 1a is made incident into an infrared ray absorbing film 2 from a second layer 22. Then, among the infrared ray IR, a wavelength component, which is relatively short in wavelength (a component whose wavelength will not exceed, for example, 8 μm) IR ($\lambda_1$) is transmitted through the second layer 22, mainly absorbed by the first layer 21 and converted to heat H. Further, among infrared ray IR, a wavelength component relatively long in wavelength (for example, a component whose wavelength will exceed, for example, 8 μm) IR ($\lambda_2$) is absorbed by the second layer 22 and converted to heat H. At this time, a part of the wavelength component IR ($\lambda_2$) arrives at a boundary surface between the first layer 21 and the second layer 22 in an attempt to transmit the second layer 22. However, it is reflected on the boundary surface due to a high reflection rate of TiN contained in the first layer 21 and finally absorbed by the second layer 22. The thus generated heat H passes through the first layer 21 containing TiN higher in thermal conductivity and arrives at a thermopile forming film 3. Then, voltage depending on the magnitude of heat H is generated in the thermopile forming film 3.

A description will be given of effects of the thermal infrared ray detector 1a and the infrared ray absorbing film 2 in the present embodiment. As shown in FIG. 2 and FIG. 3, TiN is characteristically higher in absorption rate of infrared ray IR ($\lambda_1$) over a wavelength range shorter than 8 μm than other inorganic materials, while higher in reflection rate of infrared ray IR ($\lambda_2$) over a wavelength range longer than 8 μm. Therefore, if the second layer 22 higher in absorption rate of infrared ray IR ($\lambda_2$) over a wavelength range longer than 8 μm is laminated on the first layer 21, infrared ray IR ($\lambda_2$) over a wavelength range, which is less likely to be absorbed by the first layer 21, can be favorably absorbed by the second layer 22. Further, infrared ray IR ($\lambda_2$) in an attempt to transmit the second layer 22 can also be reflected on the boundary surface of the first layer 21, returned to the second layer 22 and absorbed by the second layer 22. As a result, it is possible to absorb efficiently both infrared ray over a wavelength range shorter than 8 μm and that over a wavelength range longer than 8 μM.

The infrared ray absorbing film 2 of the present embodiment is provided on the first layer 21 containing TiN with the second layer 22 containing an Si based compound higher in absorption rate of infrared ray IR ($\lambda_2$) over a wavelength range longer than 8 μm. Thereby, it is possible to efficiently absorb infrared ray over a wider wavelength range. In particular, the wavelength from 8 μm to 14 μm are a wavelength range often used in determining radiation temperatures and detecting human bodies. Therefore, an Si based compound (SiC in particular), which is high in absorption rate of infrared ray over the above-mentioned wavelength range, is mainly contained in the second layer 22, thereby the above determination can be made accurately.

Further, an Si based compound (SiC in particular) is high in transmission rate of infrared ray in the vicinity of the wavelength 5 μm at which TiN is high in absorption rate thereof. Therefore, the second layer 22 contains mainly an Si based compound, by which infrared ray IR ($\lambda_1$) over the above-described wavelength range can be efficiently made incident into the first layer 21 to increase an absorption efficiency to a greater extent. Still further, since TiN is low in transmission rate of infrared ray, even when it is formed relatively thin (transmission rate of 10% or less at the thickness of 4000 Å, for example), TiN is used in the first layer 21, thus making it possible to reduce a film-forming time of the first layer 21. In addition, TiN is higher in thermal conductivity than other inorganic materials (about 29 W/m·K). Therefore, the first layer 21 contains mainly TiN, by which it is possible to transmit heat generated on the first layer 21 and the second layer 22 to the thermopile forming film 3 without loss of the heat by radiation or the like and also increase a response speed of the thermal infrared ray detector 1a.

Figure 5:
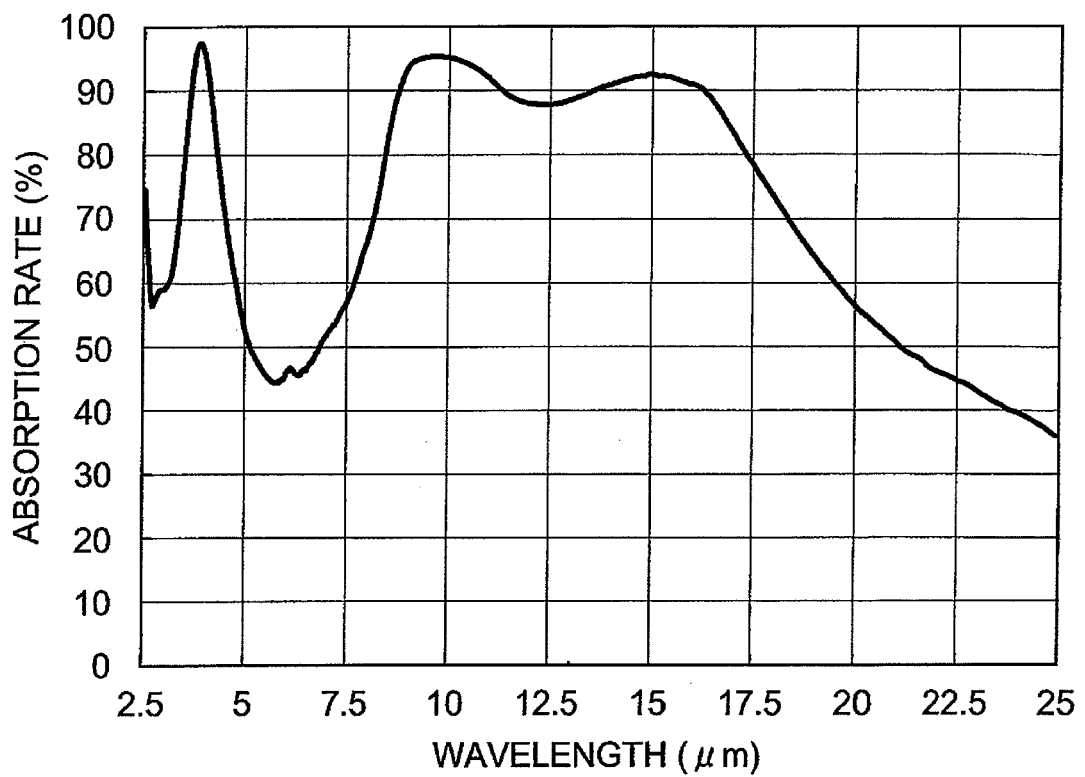
FIG. 5 is a graph showing infrared ray absorption characteristics of an infrared ray absorbing film in Embodiment 1 as a whole (absorption rate according to incident wavelength).

In this instance, FIG. 5 is a graph showing infrared ray absorption characteristics of the infrared ray absorbing film 2 of the present embodiment as a whole (absorption rate according to incident wavelength) As shown in FIG. 5, it is apparent that the infrared ray absorbing film 2 is able to efficiently absorb infrared ray both over a wavelength range longer than 8 μm (in the vicinity of 8 μm to 18 μm, in particular) and a wavelength range shorter than 8 μm (in the vicinity of 4 μm, in particular). Further, the absorption rate over a wavelength range longer than 8 μm is higher than the absorption rate of a single layer of SiC given in FIG. 2. In other words, infrared ray over the above-described wavelength range is considered to be more efficiently absorbed by the second layer 22 due to the reflection on the boundary surface between the first layer 21 (TiN) and the second layer 22 (SiC).

Further, in the infrared ray absorbing film 2 of the present embodiment, the first layer 21 containing TiN absorbs mainly infrared ray IR ($\lambda_1$) over a wavelength range shorter than 8 μm and also reflects toward the second layer 22 infrared ray IR ($\lambda_2$) over a wavelength range longer than 8 μm. As described above, one layer is provided with both a function of absorbing infrared ray IR ($\lambda_1$) over a certain range of wavelength and that of reflecting infrared ray IR ($\lambda_2$) over other ranges of wavelength to the other layer (second layer 22), thereby making it possible to efficiently absorb infrared ray over a wider wavelength range by the use of a smaller number of layers than a case where a layer mainly for reflection is provided.

Further, since TiN and an Si based compound are high in resistance to wet etching, a silicon substrate 4 can be easily subjected to wet etching. Therefore, according to the infrared ray absorbing film 2 of the present embodiment, it is possible to easily manufacture a membrane structure at which a substrate portion of the infrared ray detecting region A1 (a part corresponding to an opening 4a) is removed. In particular, where the second layer 22 contains mainly SiC and SiN as an Si based compound, SiC and SiN are higher in resistance to wet etching as compared with other Si based compounds, thereby a membrane structure can be manufactured more easily, which is more preferable.

Still further, as with the present embodiment, it is preferable that the second layer 22 is thicker than the first layer 21. TiN, which constitutes the first layer 21, is extremely small in transmission rate of infrared ray, when the thickness exceeds a certain value, and hardly varies in absorption rate or reflection rate according to a change in thickness. However, an Si based compound, which constitutes the second layer 22, will be increased in absorption rate as it is made thicker. Thus, the second layer 22 is made thicker than the first layer 21, thus making it possible to more efficiently absorb infrared ray IR ($\lambda_2$) over a wavelength range longer than 8 μm.

The above facts on the thickness of the second layer 22 clearly indicate that the second layer 22 of the present embodiment has actions different from those of a general Si based compound film used only for protecting an infrared ray absorbing film (for example, SiO$_2$ film). Specifically, a film used only for protecting an infrared ray absorbing film is in general thinner than the infrared ray absorbing film. However, the second layer 22 of the present embodiment is, as described above, preferred to be thicker than the first layer 21 because it partially constitutes the infrared ray absorbing film 2 for efficiently absorbing infrared ray.

In addition, the thickness of the first layer 21 is preferably in a range of 2500 Å to 10000 Å. Where the first layer 21 is 2500 Å or higher in thickness, it is decreased in transmission rate of infrared ray IR ($\lambda_1$) and IR ($\lambda_2$), thus making it possible to sufficiently secure the absorption rate and the reflection rate. Therefore, it is able to efficiently provide a function of absorbing infrared ray IR ($\lambda_1$) over a wavelength range shorter than 8 μm, and also a function of reflecting infrared ray IR ($\lambda_2$) over a wavelength range longer than 8 μM. Further, where the first layer 21 exceeds 10000 Å in thickness, it tends to be saturated in absorption rate of infrared ray IR ($\lambda_1$) over a wavelength range shorter than 8 μm (the absorption rate hardly increases with an increase in thickness). Thus, the first layer 21 is set to be 10000 Å or less in thickness, by which the first layer 21 can be reduced in layer-forming time.

Further, the thickness of the second layer 22 is preferably in a range of 10000 Å to 25000 Å. Where the second layer 22 is 10000 Å or higher in thickness, it can be made possible to sufficiently secure the absorption rate of infrared ray IR ($\lambda_2$). Still further, where the second layer 22 exceeds 25000 Å in thickness, it is increased in absorption rate of infrared ray IR ($\lambda_2$) in the vicinity of 100% and consequently saturated. Thus, the second layer 22 is 25000 Å or less in thickness, by which the second layer 22 can be reduced in layer-forming time.

Still further, as described above, the second layer 22 is preferably thicker than the first layer 21. An Si based compound, which constitutes the second layer 22, is thicker in thickness at which the absorption rate is saturated than TiN, which constitutes the first layer 21 (an Si based compound: 25000 Å, TiN: 10000 Å). Therefore, the second layer 22 is made thicker than the first layer 21, thereby infrared ray can be absorbed more efficiently. In addition, a ratio of the thickness of the second layer 22, $t_2$, to that of the first layer 21, $t_1$, ($t_2/t_1$) is preferably in a range of 1 to 10 and an optimal ratio is 3.

Embodiment 2

Figure 6:
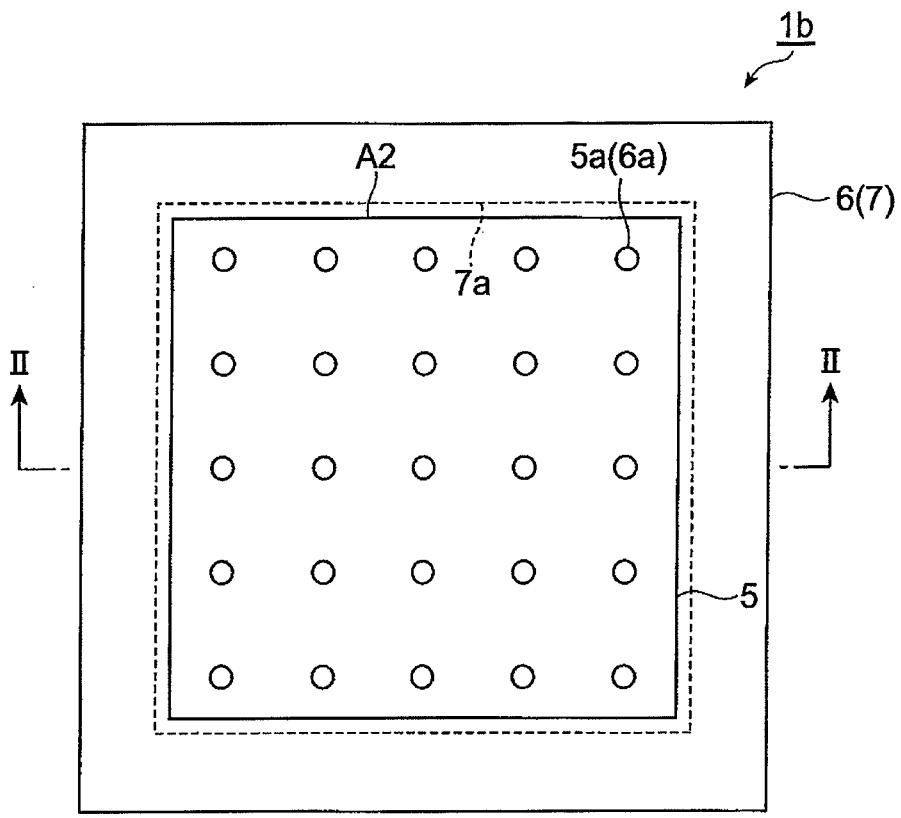
FIG. 6 is a drawing showing Embodiment 2 of a thermal infrared ray detector provided with the infrared ray absorber of the present invention.
Figure 6:
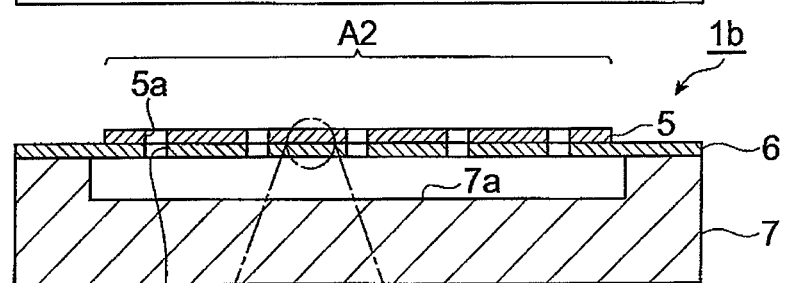
Figure 6:
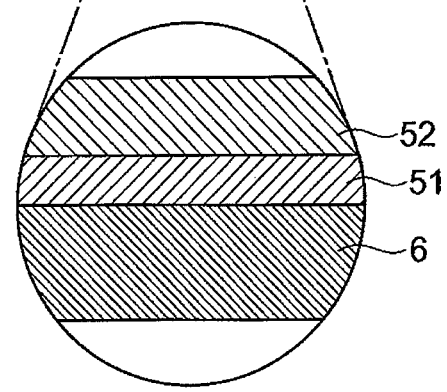

FIG. 6 (*a*) is a plan view showing Embodiment 2 of a thermal infrared ray detector provided with the infrared ray absorber of the present invention. Further, FIG. 6 (*b*) is a side sectional view showing a cross section taken along the line II-II given in FIG. 6 (*a*). Still further, FIG. 6 (*c*) is an enlarged sectional view in which FIG. 6 (*b*) is partially enlarged.

A thermal infrared ray detector 1*b* of the present embodiment is a thermal infrared ray detector, which is formed by using so-called surface micromachine technology and provided with an infrared ray absorbing film 5, a thermopile forming film 6 and a silicon (Si) substrate 7. The silicon substrate 7 is formed in a rectangular flat shape and provided with a rectangular cavity 7*a* at a part corresponding to an infrared ray detecting region A2 on the surface. In addition, the cavity 7*a* is favorably formed by wet etching.

The thermopile forming film 6 is a thermoelectric converter for converting heat from the infrared ray absorbing film 5 to an electrical quantity (electrical voltage, current and the like). The thermopile forming film 6 is provided on the silicon substrate 7 so as to cover the cavity 7*a* and constituted in such a manner that a plurality of thermoelements are arranged two dimensionally. Hot junctions (thermocouples) of the plurality of thermoelements are respectively arranged inside an infrared ray detecting region A2, and cold junctions are arranged on the surface of the silicon substrate 7 excluding the cavity 7*a*.

The infrared ray absorbing film 5 is an infrared ray absorber in the present embodiment and provided at the infrared ray detecting region A2 on the thermopile forming film 6. Since a cavity 7*a* is formed on the surface of the silicon substrate 7 corresponding to the infrared ray detecting region A2, the infrared ray absorbing film 5 constitutes a membrane structure, together with the thermopile forming film 6. The infrared ray absorbing film 5 is provided with a first layer 51 mainly containing TiN and a second layer 52 mainly containing an Si based compound such as SiC, SiN, $SiO_2$, $Si_3N_4$ or SiON and provided on the first layer 51, converting energy of infrared ray made incident from the second layer 52 to heat. In addition, as with the above-described Embodiment 1, the second layer 52 preferably contains at least one of SiC and SiN, as an Si based compound or may contain mainly $SiO_xN_y$ ($0<X\leq2$, $0\leq Y<1$).

Further, holes 5*a* and 6*a*, which penetrate through in a thickness direction, are respectively formed on the infrared ray absorbing film 5 and the thermopile forming film 6. These holes 5*a* and 6*a* are holes for allowing etchant for forming the cavity 7*a* on the silicon substrate 7 to enter into the back of the thermopile forming film 6, and a plurality of the holes are formed on the infrared ray absorbing film 5 and the thermopile forming film 6. Still further, the holes 5*a* and 6*a* also act in such a manner that the thermopile forming film 6 will not move due to a change in pressure of the cavity 7*a*, upon operation as an infrared ray detector, in particular upon nitrogen containment.

The thermal infrared ray detector 1*b* of the present embodiment is able to provide effects similar to those of the thermal infrared ray detector 1*a* of Embodiment 1.

The infrared ray absorber and the thermal infrared ray detector of the present invention shall not be limited to the above-described embodiments but can be applied to various modifications. For example, the thermal infrared ray detector of each of the above-described embodiments is constituted so as to give a thermoelectric power type equipped with a thermopile as a thermoelectric converter. However, it may be constituted so as to give, for example, a pyroelectric type equipped with a $LiTaO_3$ film and a PZT film or a resistance type equipped with a thermistor or a bolometer.

The invention claimed is:

1. A thermal infrared ray detector comprising:
   a thermoelectric converter comprising a membrane structure formed over a substrate;
   wherein the thermoelectric converter comprises a thermopile forming layer including a plurality of thermoelements;
   an infrared ray absorber in direct contact with at least the membrane structure of the thermoelectric converter;
   wherein the infrared ray absorber comprises a first layer containing titanium nitride (TiN) and a second layer containing a silicon based compound provided on the first layer, wherein the second layer is thicker than the first layer;
   wherein the membrane structure comprises a hot junction for the plurality of thermoelements and the substrate comprises a cold junction for the plurality of thermoelements; and
   wherein the thermal infrared ray detector is configured to convert energy of an infrared ray made incident from the second layer to heat.

2. A thermal infrared ray detector according to claim 1, wherein the first layer containing TiN is situated so as to be in contact with the thermoelectric converter.

3. A thermal infrared ray detector according to claim 1, wherein the first layer containing TiN is directly laminated on the thermoelectric converter.

* * * * *

UNITED STATES PATENT AND TRADEMARK OFFICE
CERTIFICATE OF CORRECTION

PATENT NO. : 8,664,510 B2  Page 1 of 1
APPLICATION NO. : 12/161868
DATED : March 4, 2014
INVENTOR(S) : Ojima et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 886 days.

Signed and Sealed this

Twenty-ninth Day of September, 2015

Michelle K. Lee
*Director of the United States Patent and Trademark Office*